United States Patent
Simeral et al.

(10) Patent No.: US 7,287,202 B1
(45) Date of Patent: Oct. 23, 2007

(54) METHOD AND APPARATUS FOR TESTING A MEMORY INTERFACE

(76) Inventors: Brad Simeral, 1049 Dolores St., #3, San Francisco, CA (US) 94110; Scott Cartier, 215 Sierra Vista Ave., Mountain View, CA (US) 94043; Morgan Teachworth, 1139 Bird Ave., #4, San Jose, CA (US) 95125

( * ) Notice: Subject to any disclaimer, the term of this patent is extended or adjusted under 35 U.S.C. 154(b) by 246 days.

(21) Appl. No.: 11/100,031

(22) Filed: Apr. 5, 2005

(51) Int. Cl.
*G11C 29/00* (2006.01)

(52) U.S. Cl. .................................. 714/718; 714/42

(58) Field of Classification Search ............ 714/2, 714/718, 720, 42; 702/118
See application file for complete search history.

(56) References Cited

U.S. PATENT DOCUMENTS

| | | | |
|---|---|---|---|
| 4,745,602 A * | 5/1988 | Morrell | 714/2 |
| 6,381,715 B1 * | 4/2002 | Bauman et al. | 714/718 |
| 6,961,881 B2 * | 11/2005 | Yamazaki et al. | 714/718 |
| 7,024,603 B1 * | 4/2006 | Lin et al. | 714/720 |
| 7,184,915 B2 * | 2/2007 | Hansquine et al. | 702/118 |
| 2006/0064561 A1 | 3/2006 | Simeral | |

* cited by examiner

*Primary Examiner*—David Ton
(74) *Attorney, Agent, or Firm*—Berkeley Law +Technology Group, LLP

(57) ABSTRACT

Methods and apparatuses of debugging and/or testing an interface are disclosed. Briefly, in accordance with one particular embodiment, testing an interface includes detecting a data exchange error in a computing system having an interface. In response to detection of the data exchange error, one or more testing operations are triggered at a subsequent time to the detection of the error.

62 Claims, 5 Drawing Sheets

METHOD AND APPARATUS FOR TESTING A MEMORY INTERFACE

BACKGROUND

Computing systems may utilize one or more memory devices, and a memory controller may at least partially control one or more operations of one or more memory devices, such as by controlling the data exchange rate and/or the timing of the data exchange, for example. A memory device may include a memory interface, which may provide particular functionality including a particular path to allow for data exchange between a memory device and one or more components of a computing system, for example, and, in at least one embodiment, a memory interface may comprise one or more busses, such as address and data busses, for example, which may have a particular bus width, such as 64 and/or 128 bits, for example. Occasionally, a memory interface may be tested, such as in response to a data exchange error, or as part of a characterization or debugging operation.

During design of a memory interface, the memory interface may be tested. Testing may be initiated manually, or may be initiated by detection of an error in the memory interface. In one particular type of testing, the occurrence of one or more data exchange errors may trigger a debugging operation, and the debugging operation may be at least partially duplicate the error, such as by subjecting the memory interface to particular types of simulated data exchange, for example. However, particular methods for testing may not adequately reproduce errors, or may not be triggered in a manner providing particularly robust testing or characterization of the interface. Therefore, techniques for addressing one or more of these limitations continue to be desired.

BRIEF DESCRIPTION OF THE DRAWINGS

Subject matter is particularly pointed out and distinctly claimed in the concluding portion of the specification. The claimed subject matter, however, both as to organization and method of operation, together with objects, features, and advantages thereof, may best be understood by reference of the following detailed description when read with the accompanying drawings in which:

DETAILED DESCRIPTION

Figure 1:
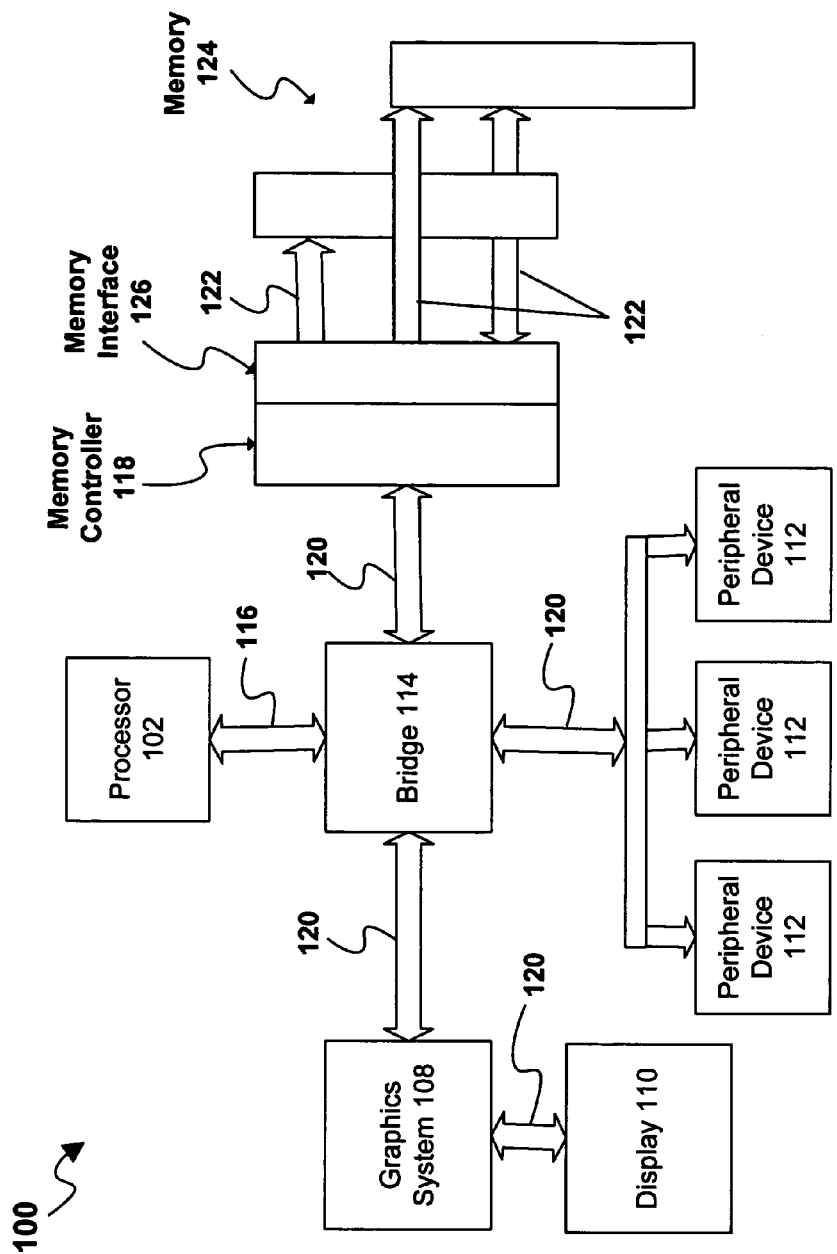
FIG. 1 is a block diagram illustrating an embodiment of a computing system.

In the following detailed description, numerous specific details are set forth to provide a thorough understanding of the claimed subject matter. However, it will be understood by those skilled in the art that the claimed subject matter may be practiced without these specific details. In other instances, well-known methods, procedures, components and/or circuits have not been described in detail so as not to obscure the claimed subject matter.

As previously suggested, a computing system may comprise one or more devices, such as one or more memory devices. One or more memory devices may comprise one or more portions, which may be referred to as partitions, in at least one embodiment. Additionally, a partition may comprise a portion of two or more memory devices, in alternative embodiments. Memory devices, such as those described, may be coupled to one or more memory interfaces. In at least one embodiment, a memory interface may provide at least one path to transmit and/or receive electrical data, also be referred to as a signal, for example, and may comprise one or more electrical '1' and/or '0' bits, such as in the form of data bits. In this context, sending and/or receiving data between two or more devices and/or components may additionally be referred to as exchanging. Electrical data may, for example, be sent to and/or received from a memory device, such as a particular memory location, or address, in the memory device. Additionally, electrical data may be stored in one or more locations in a memory device, and the data may have a particular address. One or more of the described components, such as the memory device and/or memory interface may be at least partially controlled by a memory controller. The memory controller may be capable of controlling one or more of the operations of one or more of these components, such as controlling the rate and/or timing of data exchanges, for example.

Although numerous types and/or categories of memory devices exist, and the claimed subject matter is not limited in this respect, one or more types of memory devices may include Random Access Memory (RAM) such as one or more types of Dynamic Random Access Memory (DRAM), including Synchronous Dynamic Random Access Memory (SDRAM), Dual Data Rate memory (DDR) or Dual Data Rate second generation (DDRII), for example. The DDR and DDRII specifications have been defined by JEDEC Solid State Technology Association. DDR is defined in the JEDEC specification JESD79C, adopted in September, 2003, and DDRII is defined in the JEDEC specification JESD79-2. Details regarding these specifications may be obtained from JEDEC Solid State Technology Association, 2500 Wilson Boulevard, Alexandria, Va. Additionally, more information may be obtained from the JEDEC website at the following URL: http://www.jedec.org. As is well-known, memory devices such as these are typically formed from memory cell technology, and may comprise one or more Complementary Metal-Oxide-Semiconductor (CMOS) transistor switches that may be coupled to a storage capacitor, for example. Additionally, memory devices such as these may be packaged in particular configurations, and may be packaged to be suitable for use in a computing system, for example, such as by partitioning one or more portions of memory into memory banks, which may comprise interleaved data access, for example. In one particular embodiment, one or more DRAM devices may be coupled in a Dual In-Line Memory Module (DIMM) configuration, and may, when packaged with one or more other components on a Printed Circuit Board (PCB), for example, be referred to as a chipset, for example. However, although specific types and/or categories of memory devices are explained above, it is worthwhile to note that the claimed subject matter is not so limited. For example, any type and/or category of memory may implement at least one of the following embodiments, and the claimed subject matter is not limited to implementation in a computing system, and/or to a memory device having one of the following described configurations.

Computing systems that may be capable of implementing one or more of the foregoing memory devices may comprise one or more of the following: desktop computers, laptop computers, servers, switches, and/or hubs, handheld devices, including digital cameras and/or cellular telephones, and may additionally include peripheral devices, including printers, monitors, and/or scanners, for example. Those skilled in the art will recognize, however, that the claimed subject matter is again not limited to these particular examples. Additionally, one or more of the computing systems as described above may implement one or more components in addition to memory devices as described previously or described hereinafter. For example, one or more of the aforementioned computing systems may implement one or more integrated circuit (IC) components, such as one or more microprocessors, microcontrollers, graphics processing units (GPUs), digital signal processors (DSPs), one or more memory devices, one or more application specific integrated circuits (ASICs), and may include other types of electronic components, such as capacitors, resistors, and/or connectors including input/output (I/O) connectors for coupling to external circuitry, such as bus circuitry.

As indicated above, a computing device may utilize one or more memory devices and/or one or more memory interfaces. Referring now to FIG. 1, there is illustrated a block diagram of an embodiment 100 of a computing system having a particular architecture, in accordance with the claimed subject matter. Illustrated in FIG. 1 is a computing system 100, and may comprise one or more of the computing systems as described previously or hereinafter. In this embodiment, computing system 100 is illustrated as comprising the following devices, illustrated as discrete blocks for sake of brevity. However, it is worthwhile to note that one or more of the illustrated components may comprise one or more physically and/or operationally distinct devices, or may be physically and/or operationally cohesive. Thus, computing system 100 includes: a processor 102, which may comprise a central processing unit (CPU), for example, and may be coupled to a bus such as a front side bus (FSB) 116; graphics system 108, which may comprise one or more additional devices (not shown) such as one or more memory devices, and one or more graphics processing units (GPU), and may be coupled to a display 110, which may comprise a monitor, for example; one or more peripheral components 112; a bridge 114, which may provide particular functionality to system 100, including routing and/or switching of data between one or more of the aforementioned devices, such as by use of one or more data paths 120, which may comprise one or more busses, for example; one or more interfaces not illustrated in detail, such as one or more peripheral device interfaces and/or graphics system interfaces; a memory controller 118, a memory interface 126, which may be coupled to one or more data paths 122, and one or more memory devices 124, which may comprise one or more types of memory devices, such as one or a combination of the aforementioned devices, as just an example. However, it is worthwhile to note that the claimed subject matter is not so limited, and multiple variations and/or additions may be made to the illustrated devices, and remain within the scope of the claimed subject matter.

In at least one embodiment, in operation, electronic data, such as one or more electrical '1' and/or '0' bits may be exchanged between one or more of the illustrated devices, for example. In one embodiment, processor 102 may request access to electronic data stored in memory 124, which may be referred to as a memory request. Additionally, memory 124 may have data stored in one or more particular locations in memory, such as data stored at one or more memory address locations, for example. Processor 102 may request data stored at a particular location, such as by providing one or more electrical signals to bridge 114 by use of FSB 116, and at least a portion of the electrical signal may be provided to memory controller 118, such as by a data path including memory interface 126, for example. In response to the memory request, memory controller 118 may perform particular operations, including locating the particular location or locations where the requested electronic data is stored in memory 124, for example, and/or retrieving at least a portion of the requested data, such as by utilizing memory interface 126, and/or one or more of the data paths 122, which may depend on the particular memory location(s), for example. However, again, this is just one example of an operation that may be performed by one or more of the illustrated devices, and the claimed subject matter is not limited in this respect.

As alluded to previously, data may be exchanged between one or more components of a system, such as system 100. However, data exchange may not be completed, such as due to an error, which may be referred to as a data exchange error, for example. Data exchange errors may occur in one or more devices of a computing system such as system 100 of FIG. 1. For example, a data exchange error may occur in memory controller 118, and/or may occur in one or more other devices including memory 124, processor 102 and/or memory interface 126, as just a few examples. Errors such as these may occur during operation of a computing system, such as system 100, and/or may occur during design and/or testing, such as during design and/or testing of a memory interface, such as memory interface 126, for example. In response to such errors, it may be desirable to determine the source and/or type of error. This may comprise testing the memory interface by performing one or more data exchange operations such as to isolate the source of the error. Additionally, during design of an interface, the interface may be tested. This may be performed to debug the interface, or may be performed to characterize the interface, for example. Testing a memory interface may comprise testing in response to a detected error, may comprise a debug operation that may be triggered automatically or triggered by a user, or may comprise characterizing an interface to determine one or more characteristics of the interface. Testing may be at least partially performed by initiating one or more simulated data exchanges. Data may be written and/or read by portions of memory interface 126 to perform one or more testing operations, and one or more measurements may be performed on a portion of system 100, such as to test one or more devices of system 100, for example. In one particular embodiment, a simulated data exchange may comprise substantially saturating at least a portion of one or more data paths 120 and/or 122, such as by providing approximately 64 data bits to a bus with a 64 bit width, as just an example, although the claimed subject matter is not so limited.

One or more of the aforementioned testing operations may be triggered by the detection of one or more signals, such as a particular data pattern and/or a data exchange error, but it is worthwhile to note that the claimed subject matter is not limited in this respect. For example, one or more of the testing operations may be triggered manually, such as by a user, and may not be in response to an error but may be part of a debugging or characterization process. Triggered, as used in this context, refers generally to an event that precipitates other events, such as a detection of an error that may cause the initiation of one or more debugging operations, or the execution of particular functionality by a user, such as to characterize an interface. For example, if an error is detected during the data exchange process, one or more debugging processes may be initiated to at least partially duplicate the error. Alternatively, a user may trigger particular functionality, such as a simulated data exchange, to characterize or debug an interface. However, if an error is detected, a simulated data exchange may provide the capability to at least partially determine the source of the error. The error may occur in the memory controller, memory device and/or in one or more other components of a computing system, such as externally to one or more memory components, for example. Thus, one or more portions of a computing system, such as system 100, including memory controller 118, memory 124, processor 102 and/or memory interface 126, as just a few examples, may be monitored, in order to debug and/or characterize one or more of these devices. Particular response of one or more portions of system 100 may be at least partially performed by use of a data analyzer, by providing one or more data signals to and/or from one or more devices of system 100, for example.

As alluded to previously, one or more portions of a system, such as system 100, may be tested, which may include debugging or characterizing. Characterization, in this context, may refer generally to one or more tests that may at least determine performance characteristics and/or suitability of a particular device to be implemented in a system, for example, and may be performed as part of a commissioning of a system. Debugging, in this context, may refer generally to the process of sending and/or receiving electronic data, such as in one or more data patterns and/or by the aforementioned saturation, for example, and at least partially determining the results of the sending and/or receiving on a portion of a system, such as on a memory interface, memory device and/or memory controller, and/or one or more portions of a computing system where these memory components may be implemented. In at least one embodiment, an interface may be debugged or characterized, such as after a data exchange is not completed successfully, or as part of a commissioning of a system such as system 100. However, as mentioned previously, one or more testing operations may be initiated by user, and may not be in response to an error. Particular functionality of one or more of the foregoing operations, however, may be better understood with reference to one or more of the following figures.

Figure 2A:
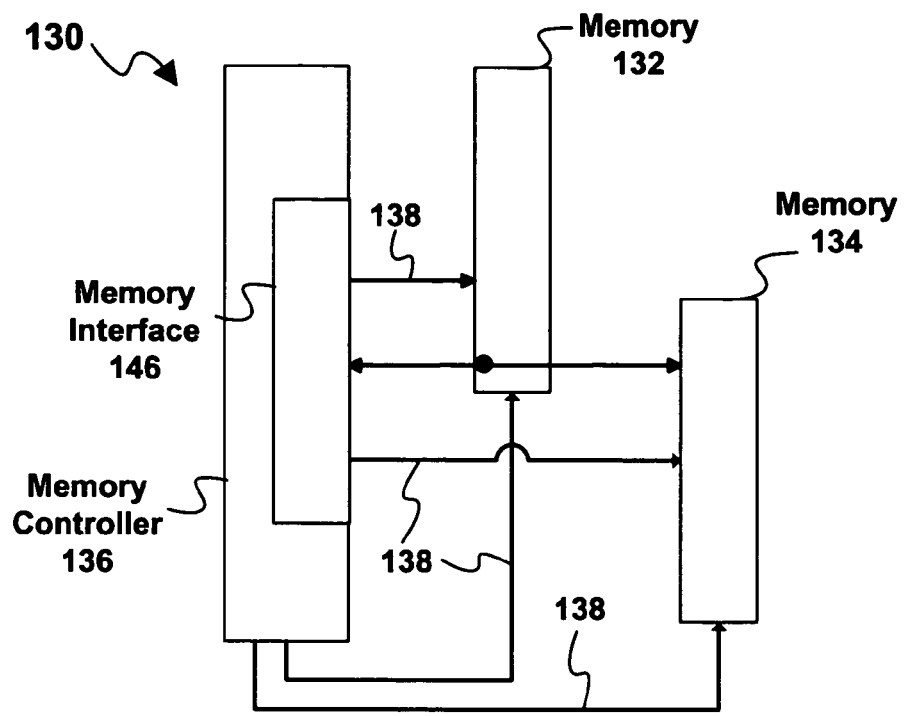
FIGS. 2a and 2b are block diagrams illustrating two embodiments of a memory controller and a memory device.

Referring now to FIG. 2a, system 130, there is illustrated a memory controller and memory device, which may comprise part of a computing system such as system 100 of FIG. 1, although the claimed subject matter is not so limited. Illustrated in FIG. 2a is memory controller 136. Although not illustrated in detail, memory controller may comprise the following components, although it is worthwhile to note that several alterations and/or variations may be made to the illustrated and described components and remain within the scope of the claimed subject matter. Here, memory controller may comprise: one or more processors, such as a CPU for the memory controller, one or more input/output (I/O) interfaces, and/or one or more components capable of performing operations, including, for example, one or more timing, caching, pre-fetching and/or precharge operations, as just a few examples. Memory controller 136 may comprise a memory interface 146, which may be configured to interface one or more memory devices 132 and/or 134 with one or more other components, such as by being coupled to one or more data paths 138, which may comprise busses, such as data address busses, and may be redundant data paths, for example. In this embodiment, memory controller 136 is coupled to a plurality of memory devices, such as 132 and 134, and is additionally coupled to data paths 138, and interface 146, for example, although the claimed subject matter is not necessarily so limited.

Figure 2B:
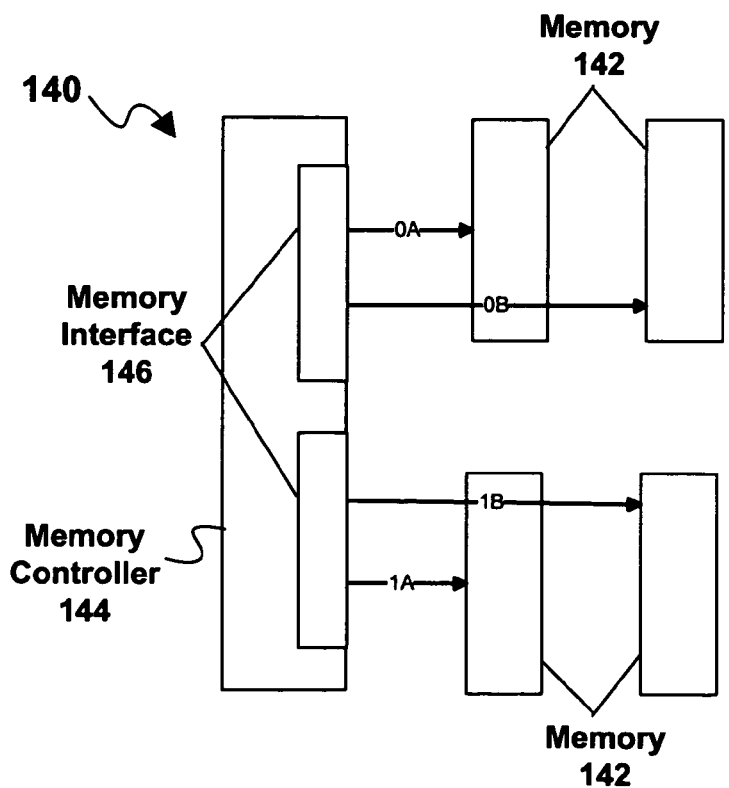

Additionally, as illustrated in FIG. 2b, system 140, a memory controller may be coupled to more than two memory devices and/or memory portions. Similarly to FIG. 2a, memory controller 144, memory interfaces 148, and/or memory 142 may comprise part of a computing system such as system 100 of FIG. 1, although the claimed subject matter is again not so necessarily limited. Additionally, although not illustrated in detail, memory controller 144 may comprise the following components, although it is worthwhile to note that several alterations and/or variations may be made to the illustrated and described components and remain within the scope of the claimed subject matter. For example, memory controller 144 may comprise one or more processors, such as a CPU, one or more input/output (I/O) interfaces, and/or one or more components capable of performing one or more operations including, for example, timing, caching, pre-fetching and/or precharge operations, as just a few examples. Memory controller 144, in this embodiment, is coupled to memory interfaces 148, which, in this embodiment are illustrated as physically distinct, but may comprise a single physical interface that comprises two or more operationally distinct portions, for example, or may comprise a single interface, for example. Additionally, coupled to memory controller 144 is memory 142, which, in this embodiment, comprises four memory portions, which may comprise separate memory devices, or may comprise four portions of a single device, such as four partitions of a single device, as just a few examples. In this embodiment, memory controller 144 and/or memory interface 148 have one or more address paths to each memory 142, illustrated as 0A, 0B, 1A and 1B, although the claimed subject matter is not so limited. Likewise, in this particular embodiment, these paths provide address data to the respective memory devices, and may provide functions including independent partition control of the portions 142, meaning, for example, that each portion of memory 142 may be utilized independently from other portions, for example. In at least one embodiment, one or more data paths, and, therefore, one or more memory portions, may be at least partially redundant, such as paths 0A and 0B, and/or paths 1A and 1B, for example, or, alternatively, paths 0A and 1B, and paths 1A and 0B may be redundant, for example. Such redundancy may be provided for a variety of reasons and the scope of the claimed subject matter is not limited to a particular situation in which components or other hardware portions may be redundant. Redundancy, in at least one embodiment, may provide the capability of sending and/or receiving substantially the same data approximately simultaneous to and/or from one or more memory locations of one or more memory devices, as just an example, which may provide synchronized memory portions or partitions 142, meaning, in this context, that multiple portions of memory may be capable of sending and/or receiving substantially similar data at substantially the same time, for example. Additionally, as one example, faster transfer of data may possible in systems that employ such redundancy and/or synchronization, for example.

In operation, memory controller 136 and/or 144 may exchange data with one or more memory devices, such as devices 132, 134 and/or 142, respectively, such as by use of one or more memory interfaces 146 and/or 148, and one or more paths 138 and/or 0A, 0B, 1A and 1B, for example, such as in the following manner: a request, such as a memory request, may be received by a memory controller, and may comprise a request to read and/or write data to and/or from one or more portions of memory. The request may be made by a component of a computing system (not shown), such as one or more of the components of computing system 100 of FIG. 1, for example, and may be provided to the memory controller by a memory interface, and via a bridge, such as bridge 114 of FIG. 1, for example. Memory controller may, in response to a request, perform one or more reading and/or writing operations, such as by accessing one or more portions of one or more of the memory devices by use of one or more memory interfaces, and reading and/or writing data to the particular one or more portions, for example. Additionally, in at least one embodiment, data may be written and/or read to and/or from two or more memory portions at substantially the same time, such as by switching the input and/or output paths to two or more memory portions at substantially the same time. In at least one embodiment, this may be referred to as a Simultaneous Switching Operation (SSO), and may comprise sending substantially the same data to a plurality of memory devices and/or portions at substantially the same time, and/or switching the output paths at substantially the same time, and then sending substantially the same data along the switched output paths, for example. This may provide the capability to access data more quickly, for example, such as by providing redundant data along two or more data paths, and/or by providing rapid output switching, for example, although the claimed subject matter is not limited in scope in this respect. Additionally, one or more operations that may incorporate SSO will be explained in more detail later.

As alluded to previously, it may be desirable to test a memory interface. Testing may comprise debugging and/or characterizing, and may be performed manually, or may be performed automatically in response to a memory request may not being completed properly, for example. Data may not be sent and/or received properly, resulting in a data exchange error. A data exchange error may occur in one or more devices, such as a memory controller, and/or may occur in one or more other devices including memory, a processor and/or memory interface, as stated previously. Errors such as these may be detected, and may be detected by use of one or more detection and/or testing devices and/or techniques. For example, a parity test may determine if data sent and/or received was sent and/or received properly, for example. Additionally, it may be desirable to determine which device an error may have occurred in, such as by determining if an error occurred in a memory device or a memory interface, and/or in one or more other portions of a computing system, for example. As alluded to previously, a data exchange error may be detected by use of one or more tests, such as a parity test and/or one or more other logical tests. In one embodiment, one particular test may comprise a logical test comprising an exclusive OR (XOR) operation. An XOR operation, in this context, may comprise one or more logical tests, wherein data, such as data that may be sent and/or received by one or more portions of system 130 and/or 140, for example, may be tested, such as by implementing one or more tests on an input and/or output path of a memory interface, for example. Testing may be performed to at least partially determine if the data was not corrupted, for example, meaning, in this context, that the data was not affected during the sending and/or receiving process, such as by being unintentionally altered and/or modified. Additionally, application of an XOR operation may be substantially comprise the following process: a set of data may be sent and/or received. The sent and/or received data may be compared to another set of data, and a determination may be made whether the data is consistent, for example, such as by producing a logical '1' or '0', for example. In one embodiment, a particular XOR operation may be capable of determining if an error occurred, and/or may be utilized to determine which device of a computing system may have caused the error, for example, such as by receiving one or more portions of data sent by one or more components of a computing system, and performing one or more XOR operations, for example, explained in more detail later.

However, the claimed subject matter is not limited to just the aforementioned tests for detecting data exchange errors. For example, one or more debugging or characterizing operations may be initiated, such as by a user. The operations may be initiated manually by a user, such as during the design process, or as part of a commissioning process. An interface, such as interfaces 146 and/or 148 of FIGS. 2a and 2b, respectively, may be tested, which may comprise debugging and/or characterizing. Testing may comprise providing an input to the memory interface, such as in the form of electronic data, and reading an output signal to ensure proper data exchange, such as by use of a parity test, and/or XOR operation. However, it is worthwhile to note that this is just one possible way to debug and/or characterize an interface, and the claimed subject matter is not so limited. Additionally, debug and/or characterization may be better understood with reference to FIG. 3, and as explained hereinafter.

Figure 3:
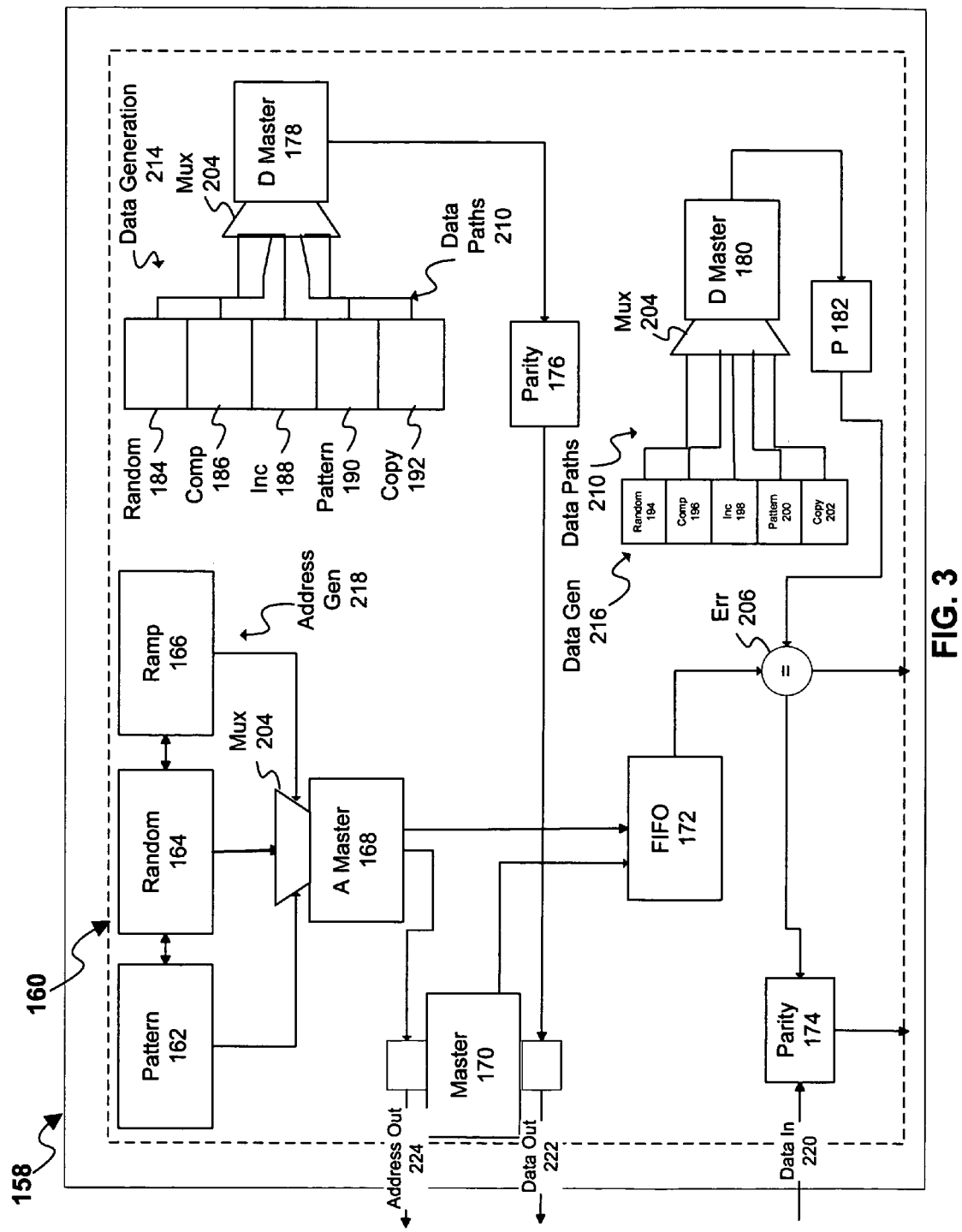
FIG. 3 is a block diagram of an embodiment of a portion of a memory controller.

Referring now to FIG. 3, there is illustrated an embodiment of a memory controller portion 158, which may comprise a system 160. System 160 may be capable of at least partially testing an interface, including debugging or characterizing a memory interface. Characterizing refers generally to a process wherein one or more properties of a device may be determined, such as by determining particular capabilities of a memory interface, including determining the ability of a memory interface to send and/or receive data by performing one or more tests, such as parity and/or other logical tests. Illustrated in FIG. 3 is a memory controller portion 158, which may comprise at least a portion of memory controller 118 of FIG. 1, memory controller 136 of FIG. 2a, and/or memory controller 144 of FIG. 2b, as just a few examples. Memory controller portion 158 may additionally comprise system 160, which may further comprise discrete hardware and/or software based components, for example, or may comprise one or more multifunction hardware and/or software based components. In this embodiment, system 160 includes: one or more data generators 214, which may be capable of generating data in accordance with one or more data schemes, including "random" 184, "compare" 186, "increment" 188, "pattern" 190 and "copy" 192, which will be explained in more detail later; one or more address generators 218, which may be capable of generating addresses in accordance with one or more address schemes, including "pattern" 162, "random" 164, and "ramp" 166, which will also be explained in more detail later; one or more data multiplexers 204; one or more data testers, including error testers 206 and/or parity testers 174 and 176; one or more master controllers, including address master 168, master 170, which may be an output master, for example, and may be capable of sending and/or receiving data, such as by sending data to one or more memory locations simultaneously in accordance with the aforementioned SSO, for example; data masters 178 and 180; one or more data paths 210; one or more FIFO (first in first out) components 172; one or more address out paths 224; one or more data out paths 222; and one or more data in paths 220. However, it is worthwhile to note that this particular system, 160, is one example embodiment and the claimed subject matter is not so limited, and many variations and/or alterations are included within the scope of the claimed subject matter. However, in this particular embodiment, system 160 may be configured to be at least partially embodied in a memory controller, such as memory controller 118 of FIG. 1, for example.

System 160 may be configured to perform one or more debugging and/or characterization operations, such as described previously. For example, system 160 may be capable of detecting one or more errors on data being sent and/or received, and may be capable of generating one or more data patterns and/or providing the one or more data patterns to one or more particular locations of memory, such as memory 124 of FIG. 1, and may provide data continually, resulting in saturation of a data path, for example, as previously described. Additionally, system 160 may be configured to read particular portions of data, such as from one or more locations of memory, including, for example, reading data in a continual manner in a particular data address pattern, and/or reading at least a portion of the data provided to one or more particular memory locations by system 160, and may be capable of testing at least a portion of the read data. For example, system 160 may be capable of performing one or more tests by use of a parity test and/or an XOR operation, and/or by one or more other logical tests and/or error checks, for example, to determine if data is being written and/or read properly. In one embodiment, although not illustrated in detail, one or more tests may be performed by providing one or more error checking components coupled to address out 224, data out 222, and/or data in 220, for example, wherein the error checking components may be capable of checking one or more addresses and/or data portions provided along one or more of the inputs and/or outputs. One or more of these tests may additionally be utilized to at least partially determine the functionality of one or more devices of a system, such as system 100, for example, such as by determining if data exchange is performed correctly along data in 220 or data out 222, for example. This may result, in at least one embodiment, in at least partially debugging and/or characterizing a data interface, and/or determining a source of an error, for example. Additionally, one or more tests and/or additional error checks may be initiated by the detection of one or more data patterns that may indicate that an error may have occurred, and/or may be initiated by a user not in response to an error as part of a characterization of one or more components of a system, for example.

One or more of the operations of system 160 may be initiated by triggering, for example. Triggering may result from the receipt and/or detection of a particular data pattern, and/or the detection of a send and/or receive error in one or more devices of a computing system. Triggering may additionally be performed by a user, which may not be in response to an error but may be for purposes including debug or characterization of an interface. Although triggering may be better understood with reference to FIG. 5, explained in more detail later, in one particular embodiment, when triggered, system 160 may perform one or more of the following operations, although the order and/or operations performed may vary in alternative embodiments. System 160, here, may have one or more data generation components 214 generate one or more sets of data, and provide at least a portion of the data to multiplexer 204. Data master 178 may determine what portion(s) of data to provide to parity block 176. Parity block 176 may perform one or more parity checks, for example, although the claimed subject matter is not limited to use of a parity check, for example.

Data provided by data master 178 may be provided to master 170, which may have the capability to provide one or more output signals, such as along address out 224 and/or data out 222, for example, and may be capable of providing data to two or more memory portions at substantially the same time, for example, such as in accordance with the aforementioned SSO, for example. At some time proximate to the data being provided to master 170, one or more components of address generation 218 may provide one or more address locations to write the data provided by data master 178, for example. The one or more address locations may be provided to master 170, and may additionally be provided to FIFO 172, for example. Master 170 may then perform one or more writing operations, such as by writing at least a portion of the data provided by data master 178 to one or more data addresses provided by address master 168, for example. Additionally, one or more additional data generation components 216 may provide one or more data sets to data master 180, and the particular data may be substantially similar to the data provided to data master 178 by data generation components 214, for example. At least a portion of this data may be provided to a parity block 182, for example, and may additionally be provided to an error check component 206, which may additionally comprise an XOR component, in one embodiment. At least a portion of the data provided to one or more memory devices by master 170 may be read by data in 220, and provided to parity block 174 and/or error check component 206, and the data may be at least partially compared, and, if the data does not match, for example, an error may be detected, such as a send error, a receive error, and/or a comparison error. However, this is merely one mode of operating, and the claimed subject matter is not so limited.

System 160 may be capable of operating in one or more modes. The particular mode of operation may be determined by a user, for example, and the particular mode may be selected based on the particular operation being performed, such as if one or more portions of a computing system where system 160 is implemented is being characterized or commissioned, and/or if system 160 is being implemented to respond to detected errors by debugging one or more portions of a computing system, for example. In one embodiment, the particular modes of operation may include a read only mode, where data may be read from one or more locations of one or more memory components, such as continually until characterization may be performed and/or until an error is detected; write mode, where data may be written to one or more memory locations of one or more memory components, such as continually until characterization may be performed, and/or until an error is detected; write/read mode, where data may be written to one or more memory locations of one or more memory components and may subsequently at least partially read and checked for errors, for example; and read/write mode, where memory may be read from one or more memory locations of one or more memory components and may additionally be written to one or more memory locations of one or more memory components, and may be copied and/or checked for errors, and/or may read and write continually until characterization may be performed, and/or until an error is detected, for example. Additionally, in at least one embodiment, one or more Simultaneous Switching Operations may be incorporated while operating in one or more of the aforementioned modes, resulting in writing and/or reading substantially similar data to and/or from multiple memory locations at substantially the same time, and/or switching input and/or output paths at substantially the same time, as just an example. However, it is worthwhile to note that the claimed subject matter is not limited to operation in the aforementioned modes, and/or to operation in SSO, for example.

Particular portions of system 160 may be capable of operating in one or more ways. For example, address generation components 218, in this embodiment, may be capable of providing addresses in accordance with one or more schemes, such as pattern schemes, random schemes, and/or ramp schemes, for example. Address generation components, here, may comprise pattern 162, random 164, and ramp 166, which may be referred to as address modes, although, in alternative embodiments, one or more substitutions and/or additions may be utilized, and/or no address generation components may be utilized in alternative embodiments. However, in this embodiment, pattern 162 may provide one or more particular memory addresses to read from and/or write data to, such as data provided by data master 178, and may provide the addresses in a particular pattern, such as to memory addresses that are shifted one or more values for each read and/or write, and/or looped between a set of data addresses, for example, although the claimed subject matter is not so limited. Random 164 may provide one or more particular memory addresses to read and/or write data, such as random and/or pseudo-random addresses, for example. Random and/or pseudo-random sequences may be generated by one or more of the components by use of one or more linear feedback shift registers (LFSR), for example. LFSRs may provide the capability to generate random sequences of numbers by use of nth order polynomials, and may be repeatable by providing the same input seed, for example. This may provide system 160 with the capability of generating random sequences for use as data and/or address generation by use of relatively small number generators, and without the need to utilize large portions of FIFO data to perform data checking, for example. Additionally, number generation may be repeatable, which may provide the capability of repeating particular sequences such as if it may be desirable to repeat a test, such as due to a failed test, for example. Ramp 166 may provide one or more particular memory addresses to read from and/or write data to, such as by ramping up or down an address list, for example, such as incrementally by 1 or 2 addresses, for example. Additionally, data generation components 214 and/or 216 may provide one or more sets of data in accordance with one or more schemes, such as random schemes, compare schemes, incremental schemes, pattern schemes and copy schemes, for example. The one or more sets of data may comprise data suitable to be written to one or more memory addresses determined at least partially by address master 168, for example. In one embodiment, the various data generation components may provide data in the following manner, which may be referred to as data modes: random 184 may generate one or more random and/or pseudo-random sets of data, such as by use of the aforementioned LFSR, and may comprise a plurality of data configurations and/or schemes, wherein one particular data configuration and/or scheme is selected for a read operation, for example; compare 186 may provide a constant set of data, such as a constant set of identical data, for example; incremental may provide one or more data sets, wherein the data in the data sets are incremented, such as in an incrementing value of 8, 16 and/or 32 bits, for example; pattern 190 may provide one or data sets having one or more particular patterns, such as sets of data that have one or more values shifted in a particular pattern for subsequent data sets, for example; and copy 192 may perform one or more copying operations, such as by copying data from one or more memory addresses, such as a previous set of data that was send and/or received without errors, for example, and providing at least a portion of the copied data to data master 178, for example. Additionally, data generation components 216 may include random 194, compare 196, incremental 198, pattern 200 and/or copy 202, and may perform one or more of the foregoing operations such as in a manner similar to the components of data generation module 214. As mentioned previously, system 160 may be capable of operating in one or more modes, including read only, write only, read/write and/or write/read. Additionally, system 160 may be capable of operating in one or more error modes, such as a parity mode, where data is parity checked, for example, and error logging and/or detection mode, where send and/or receive errors may be detected and/or logged, for example. For this embodiment, Table 1 indicates one or more modes of operation of system 160, and the particular data and address generation operational modes, as well as the error modes for each combination. It is, of course, understood that the claimed subject matter is not limited in scope to this particular embodiment.

TABLE 1

| System Mode | Address Scheme | Data Scheme | Error Mode |
| --- | --- | --- | --- |
| Write | Pattern | Pattern | Parity/Error logging/detection |
|  | Random | Random |  |
|  | Ramp | Incrementing |  |
|  |  | Compare |  |
| Read | Pattern | Pattern | Parity |
|  | Random | Random |  |
|  | Ramp | Incrementing |  |
| Read | Ramp | Copy | Error logging/detection |
| Read | Pattern | Compare | Error logging/detection |
| Write/Read | Pattern | Pattern | Error logging/detection |
|  | Random | Random |  |
|  | Ramp | Incrementing |  |
|  |  | Compare |  |
| Read/Write | Ramp | Copy | Error logging/detection |

As shown in Table 1, system 160 and data and address components are capable of operating in numerous combinations of modes and/or schemes as described above. The modes and/or schemes may depend at least in part on the particular type of debugging and/or testing operations being performed, for example, and may be selected based on the particular type of debugging and/or characterizing being performed, and/or may be configured by a user, for example. Additionally, it is worthwhile to note that selection of particular modes of operation may be performed by a user by configuring system 160 to operate in one or more particular modes and/or schemes listed above, for example. Additionally, although not described in detail, several modifications and/or substitutions of the above described modes of operation are possible while still within the scope of the claimed subject matter. Although one or more of the operations of system 160 have been briefly described, one or more of the operations of one or more of the components of system 160 may be better understood with reference to FIG. 4, below.

Figure 4:
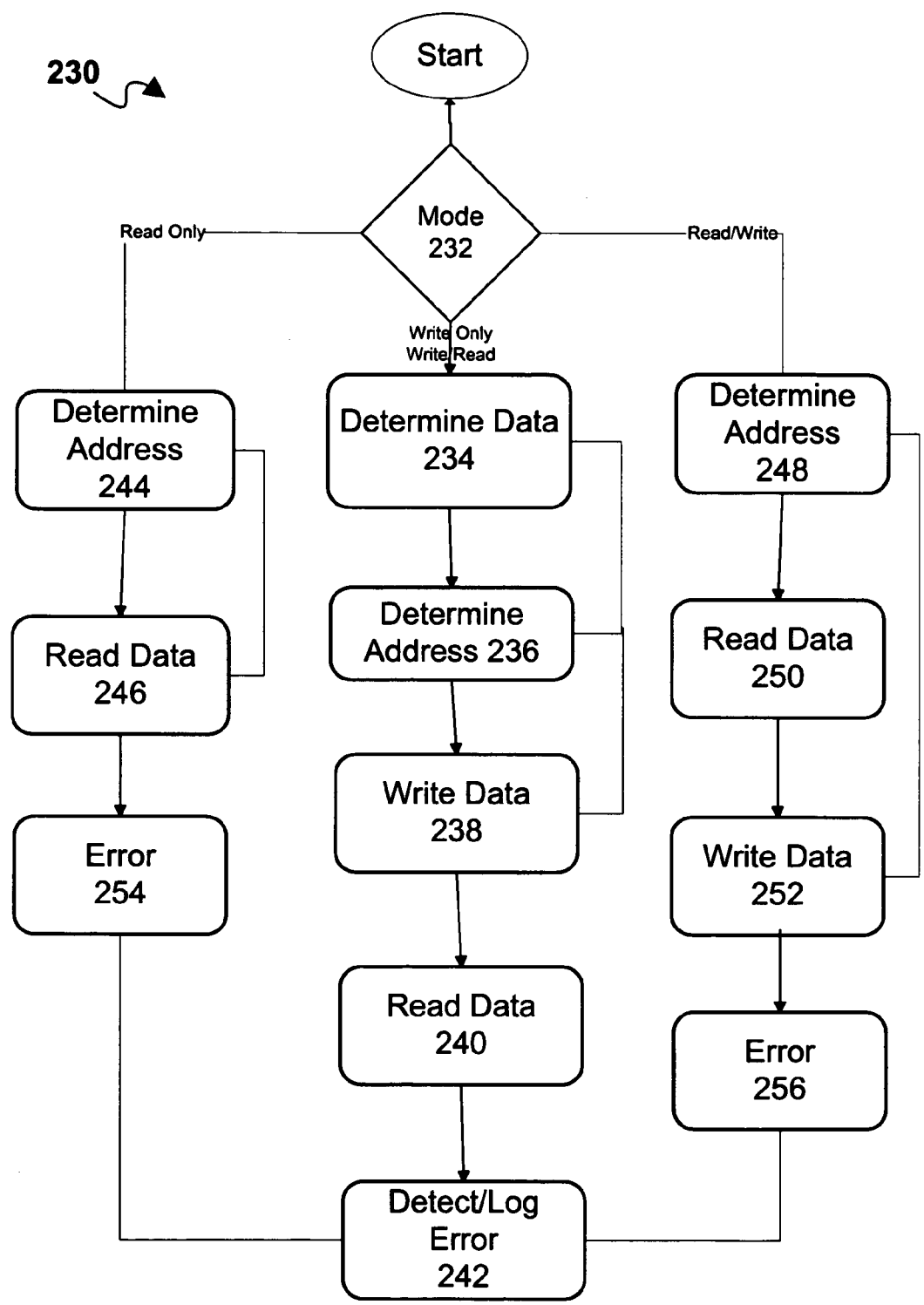
FIG. 4 is a flowchart illustrating an embodiment of a method of characterizing an interface.

Referring now to FIG. 4, there is illustrated a flowchart which may demonstrate one or more operations, such as one or more of the operations described with reference to FIG. 3, for example. One or more of the operations of FIG. 4 may be performed by a device such as a memory controller, including memory controller 118 of FIG. 1, and/or memory controllers 136 and/or 144 of FIGS. 2*a* and 2*b*, respectively, although, of course, the claimed subject matter is not limited in scope in this respect. Thus, such an embodiment may be employed to at least partially test an interface, as described below. Flowchart 230 illustrated in FIG. 4 may be implemented in a device at least in part, such as device 100 of FIG. 1, and/or device 130 of FIG. 2a, and/or device 140 of FIG. 2b, and/or system 160 of FIG. 3, for example, although the claimed subject matter is not limited in this respect. Additionally, the order in which the blocks are presented does not limit the claimed subject matter to any particular order. Likewise, intervening additional operations and/or processes not shown by intervening blocks may be employed without departing from the scope of the claimed subject matter.

Flowchart 230 depicted in FIG. 4 may, in alternative embodiments, be implemented in software, hardware and/or firmware, such as by system 100 of FIG. 1, for example, and may comprise discrete and/or continual operations. In this embodiment, an interface may be tested, such as by triggering one or more debugging and/or characterization operations. Testing may be initiated by the detection of an error in one or more portions of a computing system, such as by use of a logical test including an XOR operation, for example, and/or may be initiated by a user, such as when performing characterization of a memory interface, as explained previously. When one or more debugging and/or characterization operations are initiated, a particular mode of operating the debugging and/or characterization may initially be determined at decision block 232. At decision block 232, in this embodiment, a mode of operation is determined comprising read only, write only, write/read and read/write, although numerous other modes of operation are possible, as explained previously, and may be configured by a user, for example, and/or may be configured based on a particular error detected. In one embodiment, if a read only mode is utilized, in this embodiment, one or more addresses of one or more memory locations in which data may be read may be determined at block 244. At block 246, at least a portion of the data stored in one or more of the determined memory locations may be read, and may be read from one memory location, and/or may be read from two or more memory locations at substantially the same time, such as in accordance with the aforementioned SSO, for example. One or more of the operations of blocks 244 and/or 246 may be repeated, such as continually, and errors, such as parity errors, and/or one or more other errors such as XOR errors may be detected at block 254. The error(s) detected may be provided to error log/detection block 242, in at least one embodiment.

If a write only mode and/or a write/read mode is utilized, in this embodiment, one or more portions of data to be written may be identified at block 234. At block 236, one or more memory addresses for writing at least a portion of the memory may be determined. At least a portion of the data may be written to one or more of the above-identified memory addresses at block 238, and may be written to one memory location, and/or may be written to two or more memory locations at substantially the same time, such as in accordance with the aforementioned SSO, for example. In this embodiment, if operating in a write only mode, one or more of the operations of blocks 234 and/or 236 may be repeated, such as continually, and/or until an error is detected, for example. However, if a write/read mode is utilized, a portion of data, such as a portion of the data written at block 238 may be read at block 240. The read data may be checked, which may comprise a parity check and/or a comparison of the data to one or more other data sets, such as by use of an XOR operation, for example. If an error is detected, such as a parity error and/or a comparison error from the aforementioned XOR, the error(s) may be detected and/or logged at block 242, for example.

If a read/write mode is utilized, in this embodiment, one or more addresses of one or more memory locations in which data may be read may be determined at block 248. At block 250, at least a portion of the data stored in one or more of the determined memory locations may be read, and at block 252, at least a portion of the read data may be written to one or more memory locations, and data may be written and/or read to and/or from one memory location, and/or may be written and/or read to and/or from two or more memory locations at substantially the same time, such as in accordance with the aforementioned SSO, for example. One or more of the operations of blocks 248 and/or 250 may be repeated, such as continually, and errors, such as parity errors and/or XOR errors may be detected at block 256. The error(s) detected may be provided to error log/detection block 242, in at least one embodiment.

In this embodiment, at block 232, a read only mode may be selected to characterize and/or debug an interface, such as a memory interface, for example. In this embodiment, data may be read from one or more locations of one or more memory devices, and/or may be read from two or more memory locations at substantially the same time, such as in accordance with the aforementioned SSO, and the data may be read by use of a memory interface, for example. Reading may be performed in a continual manner, resulting in a saturation of a memory data path, in at least one embodiment. One or more parity and/or XOR tests may be performed during the read operations, and if a parity error is detected the error may be logged, for example, and may subsequently be utilized to perform debugging and/or determine one or more characteristics of a memory interface, for example.

In this embodiment, at block 232 a write only and/or a write/read mode may be selected to characterize and/or debug an interface, such as a memory interface, for example. In this embodiment, data may be written to one or more locations of one or more memory devices and/or may be written to two or more memory locations at substantially the same time, such as in accordance with the aforementioned SSO, for example, and the data may be written by use of a memory interface, for example. In this embodiment, if operating in write only mode, one or more writing operations may be continued, and if an error, such as a parity error is detected, it may be logged, for example, and may subsequently be utilized to perform debugging and/or determine one or more characteristics of a memory interface, for example. Additionally, if operating in write/read mode, at least a portion of the data written may be subsequently read, and the read data may be compared to the written data at block 242, for example. In at least one embodiment, the written and the read data may be compared, and if the data is not equal, then the one or more memory locations where the memory was stored, and/or at least a portion of the interface utilized to perform reading and/or writing operations may have an error, for example. In at least one embodiment, the error may be logged, and the logged data may be utilized to perform debugging and/or determine one or more characteristics of a memory interface, for example.

In this embodiment, at block 232 a read/write mode may be selected to characterize and/or debug an interface, such as a memory interface, for example. In this embodiment, data may be read from one or more locations of one or more memory devices and/or may be read from two or more memory locations at substantially the same time, such as in accordance with the aforementioned SSO, and the data may be read by use of a memory interface, for example. After reading at least a portion of the data, in this embodiment, at least a portion of the data may be written at block 252. The data may be written to the same location(s) it was read from, although this is not a requirement. Reading and/or writing may be performed in a continual manner and/or simultaneously to multiple memory locations, resulting in a saturation of a memory data path, in at least one embodiment. One or more parity checks may be performed during the read and/or write operations, and if a parity error is detected the error may be logged, for example, and may subsequently be utilized to perform debugging and/or determine one or more characteristics of a memory interface, for example.

Figure 5:
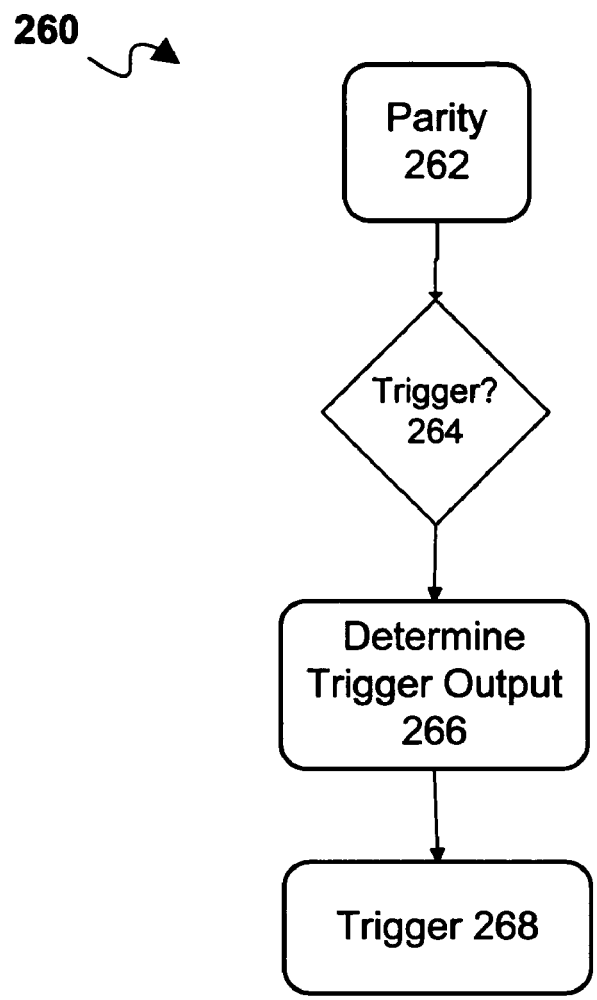
FIG. 5 is a flowchart illustrating an embodiment of a method of characterizing an interface.

As stated previously, one or more debugging and/or characterization operations may be triggered in a number of ways, such as manually by a user, after a particular time duration, and/or may be triggered on the occurrence and/or detection of an event including detection of an error, for example. An error may comprise a parity error and/or a send and/or a receive error, and/or may be detected by an XOR operation, for example, and may be detected and/or logged in a number of ways. An error log may be utilized by a device such as a memory interface, and if an error is logged in the error log, one or more of the foregoing operations may be executed, for example. Alternatively, a user may trigger a debugging operation if the user determines an error has occurred, or as part of a debugging or characterization process that may not be due to the occurrence of an error. Referring now to FIG. 5, there is illustrated one particular embodiment of triggering of a system such as system 160 of FIG. 3, which may be implemented as part of a triggering operation of a system that may be triggered in response to detected errors. However, as explained previously, triggering may not be in response to an error. However, in this embodiment, an error may be detected at block 262, and the error may be detected by reading an error log and/or by performing an error check, such as a parity check and/or by performing an XOR operation, for example. At block 264, a determination may be made regarding whether to trigger a system debug, such as system 160 of FIG. 3. A determination to trigger may be based on the type and/or number of errors received, for example. At block 266, the trigger output signal may be determined, which may comprise a selection of operating modes of a system, such as system 160 of FIG. 1, and may additionally comprise the determination of data and/or address modes, as described previously, and the determination of the one or more modes may depend at least in part on the error(s) read and/or detected at block 262, for example. At block 268, one or more operations may be triggered. This may comprise, for example, initiating one or more of the operations of system 160 of FIG. 3, for example.

In this embodiment, error detect 262 may operate by reading one or more error logs, such as an error log of a memory interface, for example, and a memory interface may provide send and/or receive error logs, in this embodiment. Additionally, parity checks may be performed on sent and/or received data, and a parity error may be detected by error detect 262, for example, and, in one embodiment, this error may not be logged, but may be provided to error detect 262, for example. Trigger decision block 262 may base a decision of whether to trigger on the occurrence of one or more particular errors, and/or after the receipt and/or detection of a particular number of errors, for example. In one embodiment, a send and/or receive error may be detected, and, as a result, the decision block 264 may be configured such that a determination is made to trigger one or more debugging operations. Conversely, if a parity error is detected, a determination may be made to not initiate debugging operations until one or more additional parity errors are detected, for example. The trigger output may be determined at block 266. This may comprise determining what type of debugging operations to initiate, and this may depend at least in part on the particular type of error detected, for example. In one embodiment, if a read error detected a particular data error, one or more read modes may be selected to be initiated to test the particular memory address to attempt to duplicate the error, for example. Additionally, a trigger output may be timed to be initiated at a particular time, such as at a particular portion of a clock cycle, for example. In one embodiment, a trigger may be executed ½ clock cycle after an error is detected, for example, and this may result in a reduction of trigger jitter, for example, although the claimed subject matter is not so limited. For example, one or more debugging operations may be triggered at some time subsequent to the detection of an error, which may comprise the detection of a particular data pattern, for example. The debugging operations may be triggered, such as at block 268, at a particular delay after the detection of an error, such as ¼ or ½ of a cycle, and may be configurable to a particular portion or number of clock cycles, and/or with a particular time delay, such as a particular number of nanoseconds delay, for example. The selection of a particular delay may be based at least in part on particular characteristics of a system operating one or more debugging operations, and may be selected based at least in part on a minimization of adverse signal affects including the aforementioned trigger jitter and/or selection of a particular clock edge, for example, although the claimed subject matter is not so limited.

It will, of course, also be understood that, although particular embodiments have just been described, the claimed subject matter is not limited in scope to a particular embodiment or implementation. In the preceding description, various aspects of the claimed subject matter have been described. For purposes of explanation, specific numbers, systems and/or configurations were set forth to provide a thorough understanding of the claimed subject matter. However, it should be apparent to one skilled in the art having the benefit of this disclosure that the claimed subject matter may be practiced without the specific details. In other instances, well-known features were omitted and/or simplified so as not to obscure the claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of the claimed subject matter.

The invention claimed is:

1. A method, comprising:
   detecting a data exchange error in a computing system;
   determining, at least partially, a portion of the computing system where the error occurred; and
   triggering one or more testing operations in response to the detection of said error, wherein the one or more testing operations are triggered at some time subsequent to the detection of said error, wherein said subsequent time is at least partially configurable, and wherein said testing operations are at least partially configurable.

2. The method of claim 1, wherein said one or more testing operations are triggered manually by a user.

3. The method of claim 1, wherein said determining the portion of the computing system where the error occurred further comprises:
performing one or more error checks on data sent to and/or received by a memory device, and determining whether the error occurred in data sent to or received from the memory device.

4. The method of claim 3, wherein said error comprises one or more of a parity error, a read error, a write error, and/or a comparison error.

5. The method of claim 4, wherein said one or more error checks comprise one or more of: a parity check and/or an Exclusive Or (XOR) operation.

6. The method of claim 4, wherein said comparison error is detected by use of an XOR operation, wherein said XOR operation is performed on data being provided to one or more memory addresses of a memory device.

7. The method of claim 3, wherein at least one of said testing operations substantially comprises:
reading data from and/or writing data to one or more particular memory addresses of said memory device in which said error was detected so that said error at least partially repeats.

8. The method of claim 7, wherein said reading and said writing are performed based at least in part on one or more schemes, including one or more address schemes and/or data schemes.

9. The method of claim 8, wherein said data is read to and/or written from two or more memory addresses at substantially the same time.

10. The method of claim 9, wherein said data is read from and/or written to two or more memory addresses in accordance with a Simultaneous Switching Operation (SSO).

11. The method of claim 8, wherein said reading further comprises:
reading data from at least one memory location of said memory device; and
at least partially altering said one or more memory locations based at least in part on one or more address schemes, and repeating said reading until an error is detected.

12. The method of claim 8, wherein said address schemes comprise one or more of: a pattern scheme, a random scheme, and/or a ramp scheme.

13. The method of claim 8, wherein at least one of said testing operations substantially comprises:
providing one or more sets of data to two or more memory addresses of said memory device at substantially the same time, wherein said data is based at least in part on one or more data schemes and said one or more memory addresses are based at least in part on one or more address schemes;
altering at least a portion of said one or more data sets by use of one or more data schemes; and
repeating said providing and said altering until an error is detected in said one or more memory addresses.

14. The method of claim 13, wherein said data is read from and/or written to two or more memory addresses in accordance with a Simultaneous Switching Operation (SSO).

15. The method of claim 14, wherein said data schemes comprise one or more of:
an incrementing scheme, a pattern scheme, a copy scheme, a random scheme, and/or a compare scheme.

16. The method of claim 15, wherein said random scheme is at least partially generated by a linear feedback shift register (LFSR).

17. The method of claim 1, wherein said subsequent time is configurable based at least in part on fractions of a clock cycle.

18. A method, comprising:
providing one or more sets of data to one or more memory locations of a memory device by use of a memory interface;
altering at least a portion of said one or more data sets and said one or more memory locations by use of one or more data schemes and address schemes, respectively; and
repeating said providing and said altering until one or more characteristics of the memory interface are determined.

19. The method of claim 18, wherein said one or more of said providing, said altering and said repeating are at least partially triggered by the detection of an error in said one or more memory locations of a memory device, wherein said triggering is at least partially time delayed, wherein said time delay is at least partially configurable.

20. The method of claim 19, wherein said lime delay is configurable at least by fractions of a clock cycle.

21. The method of claim 19, and further comprising:
determining, at least partially, the one or more memory locations where said error occurred.

22. The method of claim 19, wherein said error comprises one or more of: a parity error, a read error, a write error, and/or a comparison error.

23. The method of claim 22, wherein said comparison error is detected by an XOR operation.

24. The method of claim 23, wherein said XOR operation is performed on data being provided to said one or more memory addresses of a memory device.

25. The method of claim 19, wherein said error is detected by one or more error checks, comprising one or more of: a parity check and an Exclusive Or (XOR) operation.

26. The method of claim 18, wherein said one or more of said providing, said altering and said repeating are at least partially triggered manually by a user.

27. The method of claim 18, and further comprising:
reading back at least a portion of said one or more sets of data previously provided to said one or more memory locations;
comparing said read back data to said previously provided data; and
determining whether said read back data and said previously provided data are the same.

28. The method of claim 18, wherein said data schemes comprise one or more of:
an incrementing scheme, a pattern scheme, a copy scheme, a random scheme, and/or a compare scheme.

29. The method of claim 28, wherein said random scheme is at least partially generated by a linear feedback shift register (LFSR).

30. The method of claim 18, wherein said address schemes comprise one or more of: a pattern scheme, a random scheme, and a ramp scheme.

31. The method of claim 30, wherein said random scheme is at least partially generated by a linear feedback shift register (LFSR).

32. A method for testing a memory interface, comprising:
reading one or more sets of data from one or more memory addresses of a memory device, wherein the data is read by use of a memory interface, wherein one or more memory addresses are at least partially determined by use of an address scheme;

determining one or more additional addresses by use of said address scheme; and repeating said reading and said determining until an error is detected in said one or more memory addresses.

33. The method of claim 32, and further comprising:

determining, at least partially, the one or more memory addresses where said error occurred.

34. The method of claim 32, wherein said error is detected by use of one or more error checks implemented in said memory interface.

35. The method of claim 34, wherein said one or more error checks comprise one or more of: a parity check and/or an Exclusive Or (XOR) operation.

36. The method of claim 32, wherein said address scheme comprises one or more of: a pattern scheme, a random scheme, and/or a ramp scheme.

37. The method of claim 32, and further comprising:

providing at least a portion of said read data sets to one or more memory addresses of a memory device by use of a memory interface prior to said repeating.

38. The method of claim 32, wherein said reading, said determining and said repeating is at least partially triggered manually by a user.

39. An apparatus, comprising:

a memory controller, wherein the memory controller comprises:

one or more input/output components;

one or more data generating components coupled to the one or more input/output components;

one or more address generating components coupled to the one or more input/output components; and one or more error checking components coupled to the one or more input/output components, wherein said one or more data generating components and said one or more address generating components are configured to provide one or more data sets and one or more memory addresses, respectively, to said one or more input/output components, and wherein said one or more input/output components is configured to provide one or more data sets to said one or more error checking components.

40. The apparatus of claim 39, wherein said memory controller is configured to, in operation:

detect an error in one or more memory locations of a memory device;

provide one or more sets of data to one or more memory locations of a memory device by use of a memory interface where said error is detected;

alter at least a portion of said one or more data sets and said one or more memory locations by use of one or more data schemes and address schemes, respectively; and repeat said providing and said altering until said detected error is at least partially repeated.

41. The apparatus of claim 40, wherein said memory controller is further configured to trigger one or more of said providing, said altering and said repeating by the detection of an error in said memory interface, wherein said triggering is at least partially time delayed, wherein said time delay is at least partially configurable.

42. The apparatus of claim 41, wherein said time delay is configurable at least by fractions of a clock cycle.

43. The apparatus of claim 40, wherein said apparatus is further configured to, in operation:

determine, at least partially, the one or more memory locations where said error occurred.

44. The apparatus of claim 40, wherein said apparatus is further configured to, in operation:

read back at least a portion of said one or more sets of data previously provided to said one or more memory locations; and compare said read back data to said previously provided data; and determine whether said read data and said previously provided data are the same.

45. The apparatus of claim 40, wherein said data schemes comprise one or more of:

an incrementing scheme, a pattern scheme, a copy scheme, a random scheme, and/or a compare scheme.

46. The apparatus of claim 40, wherein said address schemes comprise one or more of: a pattern scheme, a random scheme, and/or a ramp scheme.

47. The apparatus of claim 40, wherein said memory device comprises one or more of: Dynamic Random Access Memory (DRAM), Synchronous Dynamic Random Access Memory (SDRAM), and/or Dual Data Rate (DDR), (DDR2) memory.

48. The apparatus of claim 39, wherein said one or more error checking components comprise one or more of: a parity checking component and/or an Exclusive Or (XOR) component.

49. The apparatus of claim 39, wherein said one or more data generation components and said one or more address generation components comprise at least one linear feedback shift register (LFSR).

50. A computing system, comprising:

one or more memory devices;

one or more memory controllers coupled to at least one of said one or more memory devices; and one or more data paths and one or more address paths coupled to said one or more memory devices and one or more memory controllers, at least a portion of said one or more memory controllers being configured to, in operation, provide one or more sets of data to one or more memory addresses of said one or more memory devices by use of a memory interface, alter at least a portion of said one or more data sets and said one or more memory addresses by use of one or more data schemes and address schemes, respectively, and repeat said providing and said altering.

51. The system of claim 50, wherein said one or more memory controllers are further configured to trigger one or more of said providing, said altering and said repeating by detection of an error in said computing system or manually by a user, wherein said triggering is at least partially time delayed wherein said time delay is at least partially configurable.

52. The system of claim 51, and further comprising one or more error checking components, wherein said one or more error checking components are configured to at least partially determine a location of the computing system where the error occurred.

53. The system of claim 52, wherein said one or more error checking components comprise one or more of: a parity checking component and/or an Exclusive Or (XOR) component.

54. The system of claim 51, wherein said error comprises one or more of: a parity error, a read error, a write error, and/or a comparison error.

55. The system of claim 54, wherein said comparison error is detected by an XOR operation.

56. The system of claim 51, wherein said time delay is configurable at least by fractions of a clock cycle.

57. The system of claim 50, wherein at least a portion of said memory controllers is further configured to, in operation:
provide one or more sets of data to said one or more memory addresses of said one or more memory devices by use of said memory interface;
alter at least a portion of said one or more data sets and said memory location by use of one or more data schemes and address schemes, respectively; and
repeat said providing and said altering until one or more characteristics of the memory interface are determined.

58. The system of claim 50, wherein said data schemes comprise one or more of:
an incrementing scheme, a pattern scheme, a copy scheme, a random scheme, and/or a compare scheme.

59. The system of claim 58, wherein said random scheme is at least partially generated by a linear feedback shift register (LFSR).

60. The system of claim 50, wherein said address schemes comprises one or more of: a pattern scheme, a random scheme, and/or a ramp scheme.

61. The system of claim 60, wherein said random scheme is at least partially generated by a linear feedback shift register (LFSR).

62. The system of claim 50, wherein said one or more memory devices comprise one or more of: Dynamic Random Access Memory (DRAM), Synchronous Dynamic Random Access Memory (SDRAM), and/or Dual Data Rate (DDR), (DDR2) memory.

* * * * *